(12) United States Patent
El-Ibiary

(10) Patent No.: US 6,862,538 B2
(45) Date of Patent: Mar. 1, 2005

(54) INDUCTION MOTOR MODULE AND MOTOR INCORPORATING SAME

(75) Inventor: Yehia El-Ibiary, Simpsonville, SC (US)

(73) Assignee: Reliance Electric Technologies, LLC., Mayfield Heights, OH (US)

( * ) Notice: Subject to any disclaimer, the term of this patent is extended or adjusted under 35 U.S.C. 154(b) by 246 days.

(21) Appl. No.: 10/201,073

(22) Filed: Jul. 23, 2002

(65) Prior Publication Data

US 2004/0019439 A1 Jan. 29, 2004

(51) Int. Cl.$^7$ .............................................. G06F 19/00
(52) U.S. Cl. ....................................................... 702/38
(58) Field of Search ........................................... 702/38

(56) References Cited

U.S. PATENT DOCUMENTS

| | | | | |
|---|---|---|---|---|
| 6,035,265 A | * | 3/2000 | Dister et al. ................ 702/183 |
| 6,042,265 A | * | 3/2000 | Kliman et al. .............. 374/152 |
| 6,138,078 A | * | 10/2000 | Canada et al. ................ 702/44 |
| 6,236,947 B1 | * | 5/2001 | Dowling et al. .............. 702/38 |
| 6,434,491 B1 | * | 8/2002 | Miyata et al. ................ 702/38 |
| 2002/0079859 A1 | * | 6/2002 | Lumsden .................... 318/727 |

* cited by examiner

Primary Examiner—Donald McElheny, Jr.
(74) Attorney, Agent, or Firm—Ralph A. Graham; Alexander M. Gerasimow

(57) ABSTRACT

A system and method for establishing estimated values of a plurality of electrical parameters of a motor. The plurality of electrical parameters may be established from stator resistance data and electrical input data obtained with no load on the motor. The plurality of electrical parameters may also be established from stator resistance data, electrical input data, and motor speed data obtained at at least two load conditions of the motor. The plurality of electrical parameters may comprise rotor resistance. The system and method may also be used to estimate a plurality of operating parameters of the motor based on the estimated values of a plurality of electrical parameters of the motor. The plurality of operating parameters of a motor may comprise rotor temperature, motor torque, and motor efficiency.

35 Claims, 5 Drawing Sheets

INDUCTION MOTOR MODULE AND MOTOR INCORPORATING SAME

BACKGROUND OF THE INVENTION

The present invention relates generally to the field of electric motors. More particularly, the invention relates to a novel technique for estimating unknown parameters of an induction motor based on motor data obtained at a plurality of operating points or a no-load operating point.

A wide variety of induction motors are available and are currently in use throughout a range of industrial applications. In general, such motors include a stator provided in a motor housing and a rotor surrounded at least partially by the stator and supported for rotation within the housing. The stator and rotor may be mechanically and electrically configured in a variety of manners depending upon a number of factors, including: the application, the power available to drive the motor, and so forth. In general, however, electric power is applied to the stator to produce a rotating magnetic field to drive the rotor in rotation. Mechanical power is transmitted from the motor via an output shaft coupled to the rotor.

Motor operating parameters, such as output torque or efficiency, may only be determined with the motor in operation. Knowledge of these motor operating parameters may be important for a number of reasons. However, the devices used to measure motor operating parameters may interfere with the operation of the motor or may be relatively expensive. In addition, it may be difficult to measure the operating parameter. For example, it may be desireable to maintain the temperature of the rotor below a specific temperature. However, it is extremely difficult to measure the rotor temperature. In addition, it may be desirable to establish the torque and/or efficiency of a given motor to ensure that the proper motor is used in a given application. However, a typical torque measuring device requires the motor to be disconnected from its load each time the torque measurement is desired, interfering significantly with the operation of the motor. Previous attempts to develop a device to estimate motor operating parameters, such as torque and efficiency, have relied on motor nameplate data. However, these attempts have not yielded accurate results. Alternatively, a customer may not have the values of the motor electrical parameters that might be used to develop an estimate of various motor operating parameters.

A need exists for a technique for obtaining electric motor operating parameter data that is less expensive than conventional methods and which minimizes the disruption to the operation of a system incorporating the electric motor. In addition, a need exists for a technique that enables motor electrical parameter data that may be used to estimate motor operating parameters to be estimated.

SUMMARY OF THE INVENTION

The present invention provides a novel technique for establishing estimated values of a plurality of electrical parameters of a motor. The plurality of electrical parameters may be established from stator resistance data and electrical input data obtained with no load on the motor. The plurality of electrical parameters may also be established from stator resistance data, electrical input data, and motor speed data obtained at at least two load conditions of the motor. The plurality of electrical parameters may comprise rotor resistance. The system and method may also be used to estimate a plurality of operating parameters of the motor based on the estimated values of a plurality of electrical parameters of the motor. The plurality of operating parameters of a motor may comprise rotor temperature, motor torque, and motor efficiency.

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

Figure 1:
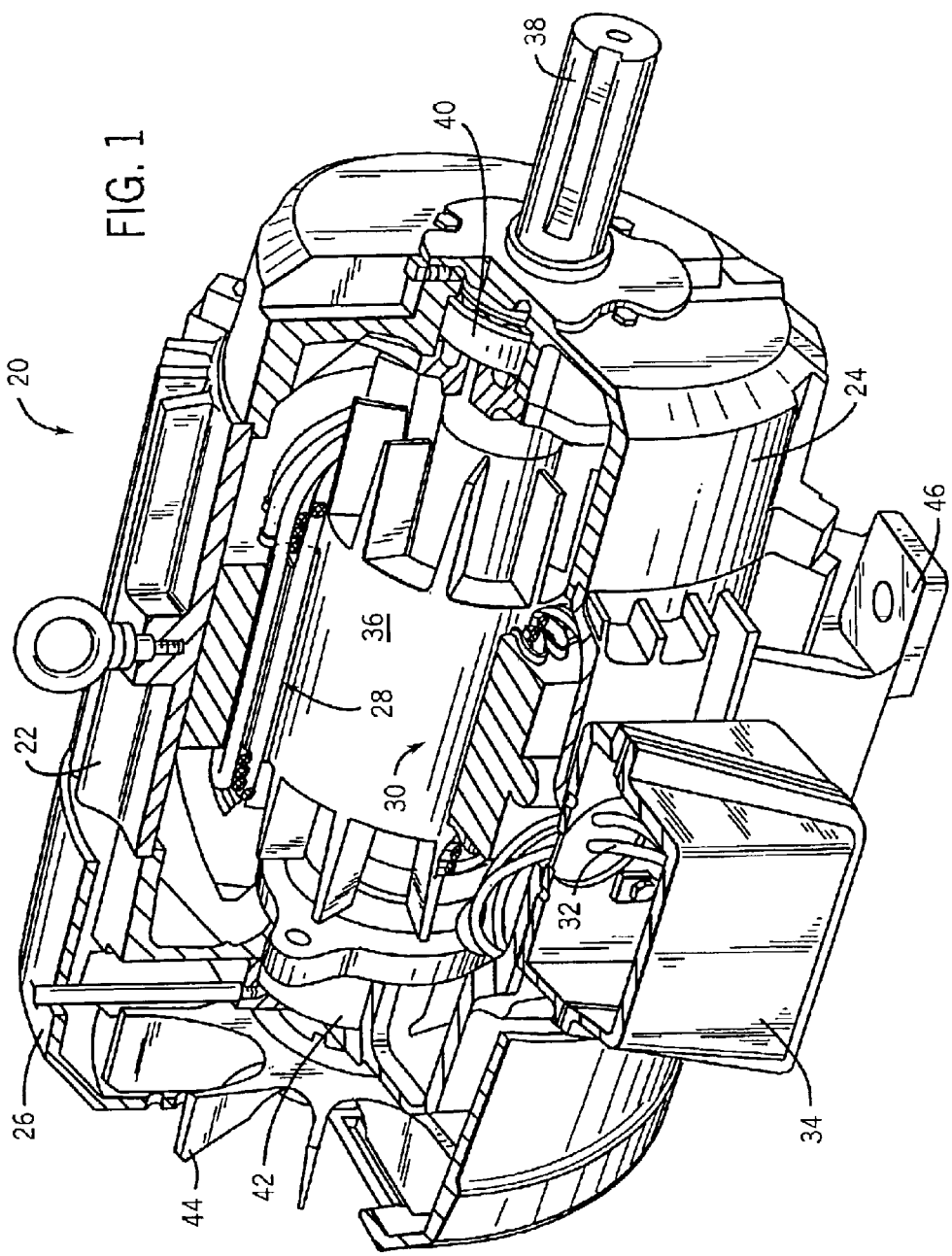
FIG. 1 is a perspective view of an electric motor illustrating the various functional components of the motor including a rotor and a stator, in accordance with certain aspects of the invention.

Turning now to the drawings, and referring first to FIG. 1, an electric motor is shown and designated generally by the reference numeral 20. In the embodiment illustrated in FIG. 1, motor 20 is an induction motor housed in a conventional NEMA enclosure. Accordingly, motor 20 includes a frame 22 open at front and rear ends and capped by a front end cap 24 and a rear end cap 26. The frame 22, front end cap 24, and rear end cap 26 form a protective shell, or housing, for a stator assembly 28 and a rotor assembly 30. Stator windings are electrically interconnected to form groups, and the groups are, in turn, interconnected. The windings are further coupled to terminal leads 32. The terminal leads 32 are used to electrically connect the stator windings to an external power cable (not shown) coupled to a source of electrical power. Energizing the stator windings produces a magnetic field that induces rotation of the rotor assembly 30. The electrical connection between the terminal leads and the power cable is housed within a conduit box 34.

In the embodiment illustrated, rotor assembly 30 comprises a cast rotor 36 supported on a rotary shaft 38. As will be appreciated by those skilled in the art, shaft 38 is configured for coupling to a driven machine element (not shown), for transmitting torque to the machine element. Rotor 36 and shaft 38 are supported for rotation within frame 22 by a front bearing set 40 and a rear bearing set 42 carried by front end cap 24 and rear end cap 26, respectively. In the illustrated embodiment of electric motor 20, a cooling fan 44 is supported for rotation on shaft 38 to promote convective heat transfer through the frame 22. The frame 22 generally includes features permitting it to be mounted in a desired application, such as integral mounting feet 46. As will be appreciated by those skilled in the art, however, a wide variety of rotor configurations may be envisaged in motors that may employ the techniques outlined herein, including wound rotors of the type shown, and so forth. Similarly, the present technique may be applied to a variety of motor types having different frame designs, mounting and cooling styles, and so forth.

Figure 2:
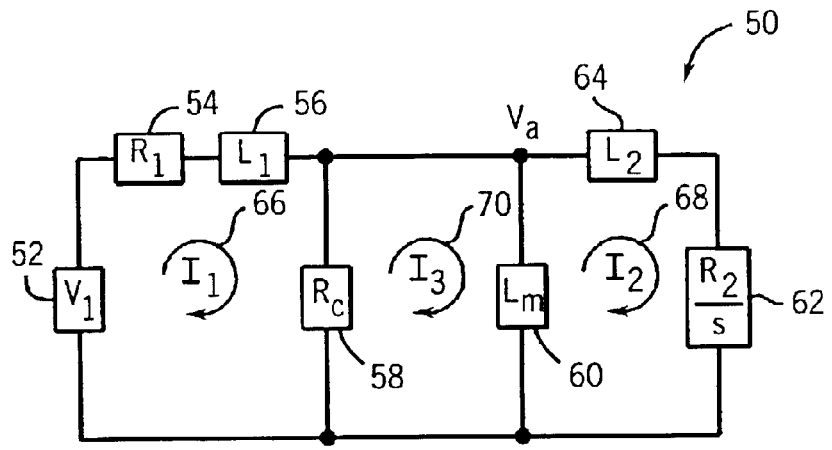
FIG. 2 is the single-phase steady state equivalent schematic circuit of an induction motor, according to an exemplary embodiment of the present invention.

Referring generally to FIG. 2, an equivalent circuit for steady state operation of the induction motor of FIG. 1 is shown and designated generally by the reference numeral 50. The induction motor is powered by an AC power source, designated by reference numeral 52, having a voltage amplitude $V_1$ and a frequency $\omega$. The stator of the motor has an electrical resistance $R_1$, as represented by reference numeral 54, and a leakage inductance $L_1$, as represented by reference numeral 56. The motor also has core loss resistance $R_c$ due to core losses in the stator and rotor, designated by the reference numeral 58. The motor also has a magnetizing inductance $L_m$, designated by reference numeral 60. The rotor also has an electrical resistance $R_2$, designated by reference numeral 62. As illustrated, the rotor resistance $R_2$ is modified by dividing the rotor resistance $R_2$ by the slip s of the rotor. Finally, the rotor also has a leakage inductance $L_2$, as represented by reference numeral 64. Electric current flows through the stator to produce the magnetic field. The electric current $I_1$ through the stator is represented by arrow 66. In addition, the magnetic field induces an electric current $I_2$ in the rotor, as represented by arrow 68. Finally, electric current flowing through the core loss resistance $R_c$ and the magnetizing inductance $L_m$ is represented by arrow 70.

In a typical AC circuit, the voltage and current vary over time. In an inductive circuit, such as an induction motor, the voltage leads the current by an angle, known as the phase angle $\Phi$. In addition, some power is alternately stored and released by the inductance of the circuit. This power is known as the "reactive power." In addition, the resistance of the circuit dissipates power as heat and the load utilizes a portion of the input power, this power is known as the "real power." The "apparent power" is the product of the total voltage and the total current in the AC circuit. The ratio between the real power and the apparent power of a load in an AC circuit is known as the "power factor" of the load. The cosine of the phase angle is the power factor.

Figure 3:
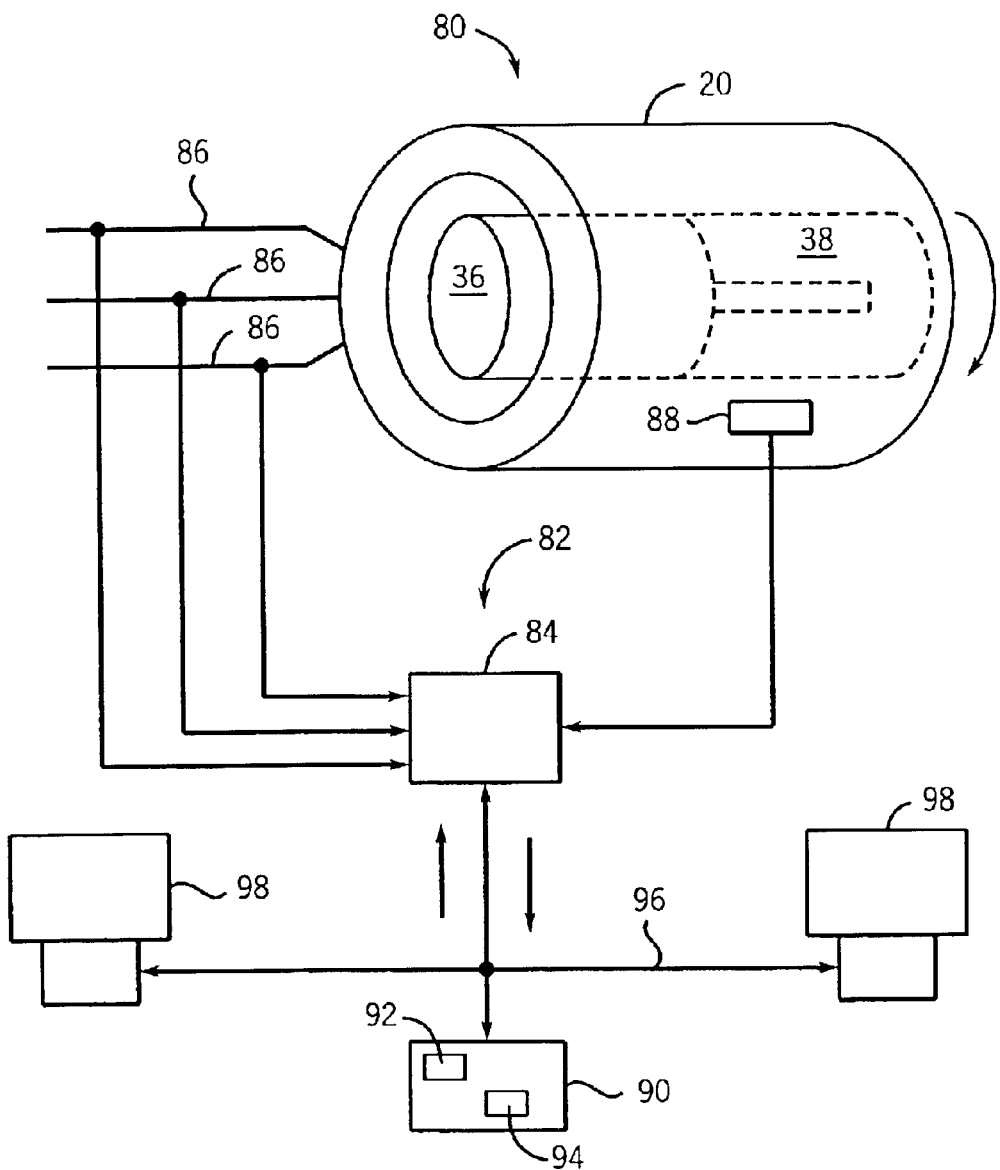
FIG. 3 is a system for providing estimated values of various motor operating parameters, according to an exemplary embodiment of the present invention.

Referring generally to FIG. 3, a system for providing estimated values of various motor electrical parameters and motor operating parameters is shown and designated generally by reference numeral 80. The system 80 comprises a data processing module 82 that is electrically coupleable to the motor 20. The data processing module 82 is operable to utilize data obtained at a two load conditions of the motor 20 to establish values of various electrical parameters of the motor, such as the electrical resistance of the rotor and the leakage inductance of the stator and rotor. The data processing module then uses the values of the estimated motor electrical parameters to estimate motor operating parameters, such as the temperature of the rotor, the torque of the motor, and the efficiency of the motor. The data processing module 82 may be provided as a stand-alone device, as part of a motor, or in a kit form to be added to an existing installed motor.

In the illustrated embodiment, the data processing module 82 has a processor module 84. Preferably, the processor module 84 utilizes a processor (not shown) and operates in accordance with programming instructions to produce estimates of various motor operating parameters. The processor module 84 may have analog-to-digital converters for converting analog data into digital data. In this embodiment, the processor module 84 is electrically coupled to each phase 86 of the input power to the motor 28 to enable the module to receive electrical input data, such as the input voltage, current, frequency, and power. However, the data also may be entered into the system manually. The input voltage data may be the line-to-line voltage or the phase voltage. The average phase voltage for a star connection may be established by averaging the three line-to-line voltages and dividing by the $\sqrt{3}$. The average line current is the phase current. Input power data also may be obtained directly or calculated from the stator voltage, current, and resistance data. A speed sensor 88 also is electrically coupled to the processor module 84. The speed sensor 88 may be integral with the motor or a separate device coupled to the processor module 84. The speed sensor 88 may measure the speed of the shaft 38 coupled to the rotor 36 in order to establish rotor speed. Alternatively, the speed sensor 88 may measure the speed of the rotor 36 directly.

In the illustrated embodiment, the system 80 is operable to output motor electrical parameter data and motor operating parameter data to a control panel 90. Preferably, the control module 90 has a visual display 92 to provide visual indications of the various parameters. Preferably, the control module 90 has a keypad or keyboard 94 to enable data, such as the electrical input data, rotor speed data, and any known motor electrical parameters, to be inputted into the processor module 84. In addition, in the illustrated embodiment the processor module 84 and the control module 90 are coupled to a network 94 to enable data to be transferred to or from remote terminals 96. The remote terminals 96 may be personal computers, or other digital communication devices.

The electrical input data may also be measured at the motor controller, rather than at the motor itself. However, in certain applications the motor controller may be quite remote from the motor. To facilitate the measurement of data at the motor, such as the rotor speed, and at other locations, such as at a motor controller, a time log of the measured voltages, currents, power and frequency may be used to record data. The voltages, currents, power and frequency corresponding to the time of the speed measurement are retrieved from the time log and matched to the speed of the rotor at that time. The effect on the electrical input data caused by taking the measurement at the motor controller may also be compensated for. First, the length of the cable between the motor and the starter may be measured. In addition, the ambient temperature is measured and the gauge of the cable identified. The diameter of the conductor may be calculated from the gauge of the cable. The resistance of the cable may be estimated based on the operating temperature, the length and diameter of the cable. The cable resistance is then subtracted from the total measured resistance to establish the stator resistance. Furthermore, the power loss in the cable may be established from the measured current and estimated cable resistance. The cable power is then subtracted from the measured power to obtain the power delivered to the motor.

Figure 4:
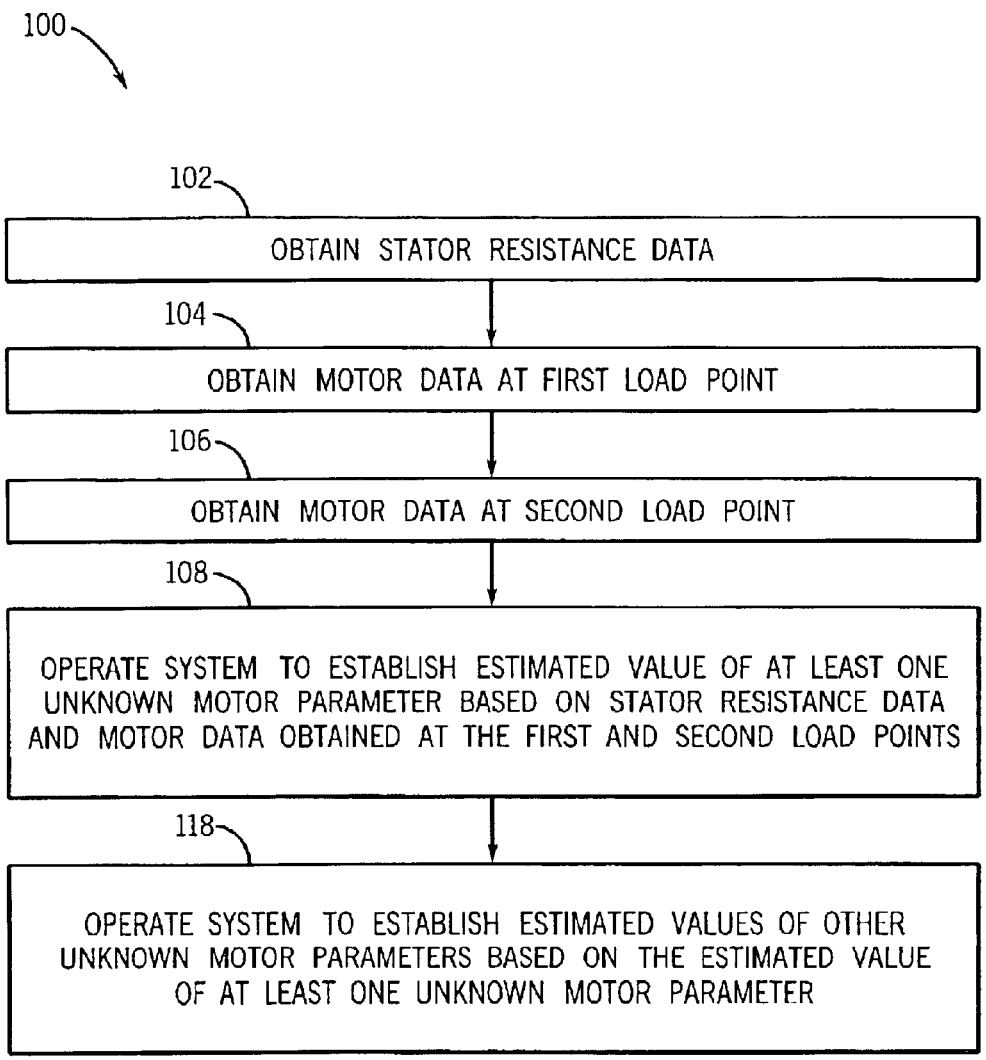
FIG. 4 is a process for providing estimated values of various motor operating parameters based on data obtained at two load conditions of the motor, according to an exemplary embodiment of the present invention.

Referring generally to FIG. 4, a process for establishing values of various motor electrical parameters and various motor operating parameters using the system of FIG. 3 is shown and designated generally by reference numeral 100. The process comprises obtaining the resistance of the stator, as represented by block 102. The process also comprises obtaining data at a first operating load point and providing the data to the processor module 84, as represented by block 104. In a presently contemplated embodiment, the data obtained at the first load point comprises: input voltage data, input current data, input power data, and shaft speed data.

Some data may be provided to the system 80 using the control module 90 or may be provided from a remote station 98 via the network 96. Preferably, the motor has a low load at the first operating point.

The process also comprises obtaining data from the motor at a second load point and providing the data to the processor module 84, as represented by block 106. The stator resistance $R_1$ data need only be obtained once if the stator temperature is obtained at each load point. Preferably, the motor has a full load at the second load point.

Figure 5:
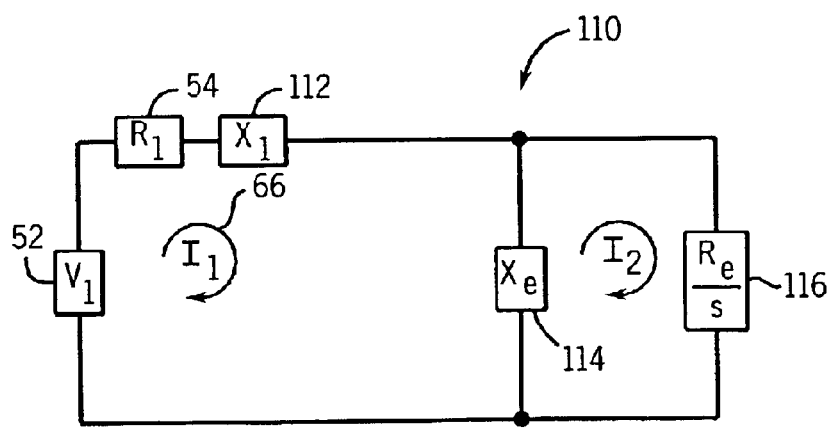
FIG. 5 is an alternative equivalent schematic circuit of a steady state induction motor, according to an exemplary embodiment of the present invention.

The data processing module 82 may then be operated to establish estimated values of various motor parameters, as represented by block 108. The programming instructions provided to the data processing module 82 are adapted to utilize a novel technique for establishing the values of the various motor parameters. The equivalent circuit of FIG. 2 provides a starting point to illustrate the development of the technique for estimating various motor parameters. Referring generally to FIG. 5, an equivalent circuit, designated generally by reference numeral 110, to the circuit of FIG. 2 is illustrated. In FIG. 5, each inductance illustrated in FIG. 2 is converted into an inductive reactance to facilitate solving for the unknown motor parameters. In addition, some of the reactances are combined to simplify the circuit 110. The stator leakage reactance $X_1$, designated by reference numeral 112, is a function of the electrical frequency $\omega$ of the power source and the stator leakage inductance $L_1$. The equivalent reactance $X_e$, designated by reference numeral 114, is a function of the magnetizing reactance $X_m$, the rotor resistance $R_2$, the slip s and the rotor leakage reactance $X_2$. The magnetizing reactance $X_m$, in turn, is a function of the electrical frequency $\omega$ and the magnetizing inductance $L_m$. The rotor leakage reactance $X_2$ is a function of the electrical frequency $\omega$ and the rotor leakage inductance $L_2$. The equivalent resistance $R_e$, designated by reference numeral 116, is a function of the rotor resistance $R_2$, the leakage reactance $X_2$, the slip s, and the core loss resistance $R_c$. Of the parameters illustrated in FIGS. 2 and 5, the stator resistance $R_1$ and the motor slip s can be measured relatively easily. This leaves the values of five parameters to be established: $X_1$, $R_2$, $X_2$, $R_c$ and $X_m$. These parameters are more difficult to measure than the stator resistance $R_1$ and the motor slip s.

Several assumptions and an approximation are made to simplify the process of developing a technique for estimating $X_1$, $R_2$, $X_2$, $R_c$, and $X_m$. Namely, it is assumed that the frequency of the power is constant, that the speed of the rotor does not change during the gathering of the load point data, and that the reading of the data is done quickly so that the rotor temperature is constant during the gathering of the data. Additionally, it has been established experimentally that excellent results are obtained by estimating the stator leakage reactance $X_1$ to be 5% of the magnetizing reactance $X_m$, or:

$$X_1 = 0.05 X_m. \tag{1}$$

However, this factor may range from 0.02 to 0.07. By making this approximation the number of unknowns is reduced to four. Thus, only four equations are needed to solve for the values of the remaining unknown motor parameters. However, the equations relating these unknowns are highly nonlinear and an expression for the remaining unknowns by using measurements obtained at two load points is nontrivial. In the present technique, this process is facilitated by obtaining an actual value for the stator leakage reactance $X_1$. This value is then used in finding the values of the remaining unknowns.

In addition, the rotor leakage inductance $L_2$ and magnetizing inductance $L_m$ are converted into reactances in FIG. 4 to assist in solving the various unknown motor parameters. Reactance is a function of the inductance and the frequency $\omega$ of the circuit. The reactances were combined with the rotor resistance $R_2$ and the core loss resistance $R_c$ to form an equivalent reactance $X_e$ and a total resistance $R_t$. At a first load point, the total resistance $R_{t1}$ is given by the following equation:

$$\frac{1}{R_{t1}} = \frac{1}{R_c} + \frac{1}{\left(\frac{R_2}{s_1} + \frac{s_1 X_2^2}{R_2}\right)}. \tag{2}$$

The first term on the right side of the equation is the reciprocal of the core loss resistance $R_c$ and the second term is the reciprocal of the new modified rotor resistance as a result of factoring the rotor leakage reactance $X_2$. At the second load point, the total resistance $R_{t2}$ is given by the following equation:

$$\frac{1}{R_{t2}} = \frac{1}{R_c} + \frac{1}{\left(\frac{R_2}{s_2} + \frac{s_2 X_2^2}{R_2}\right)}. \tag{3}$$

Similarly, the equivalent reactances at the two motor load points $X_{e1}$ and $X_{e2}$ are given by the following equations:

$$\frac{1}{X_{e1}} = \frac{1}{X_m} + \frac{X_2}{\left(\frac{R_2^2}{s_1^2} + X_2^2\right)}; \text{ and} \tag{4}$$

$$\frac{1}{X_{e2}} = \frac{1}{X_m} + \frac{X_2}{\left(\frac{R_2^2}{s_2^2} + X_2^2\right)}. \tag{5}$$

The right hand sides of equations (4) and (5) also have two terms, one resulting from the magnetizing reactance $X_m$ and the other resulting from factoring the rotor leakage reactance $X_2$.

The following equations for equivalent reactance $X_e$ and equivalent resistance $R_e$ may be developed using FIG. 5 and data obtained at the two load points of the motor. The equation for the equivalent reactance $X_e$ is given as follows:

$$X_e = \frac{-B}{2A} + \frac{\sqrt{B^2 - 4AC}}{2A}, \tag{6}$$

where A, B, and C are given by:

$$A = 1.05 * 0.05 * s I_1^2; \tag{7}$$

$$B = -1.1 I_1 V_{1I} s; \text{ and} \tag{8}$$

$$C = V_{1I}^2 s + (s R_1 I_1 - s V_{1R})(I_1 R_1 - V_{1R}). \tag{9}$$

$V_{1I}$ is the imaginary portion of the voltage and is a function of the amplitude of the power source voltage $V_1$ and the sine of the power factor angle. $V_{1R}$ is the real portion of the voltage and is a function of the amplitude of the power source voltage $V_1$ and the cosine of the phase angle. In addition, the equivalent resistance $R_e$ is given by the following equation:

$$R_e = \frac{sX_e(V_{1j} - .05I_1X_e)}{(V_{1R} - I_1R_1)}. \tag{10}$$

As discussed above, it was assumed that the stator leakage reactance is 5%, or 0.05 of the magnetizing reactance $X_m$. With no load on the motor, the rotor section of the circuit is considered open and the value for the slip s is considered to be zero. The total reactance of the circuit is made of the sum of the stator leakage reactance $X_1$ and the magnetizing reactance $X_m$. Since $X_1$ can be expressed as equal to 0.05 $X_m$, then the total no-load reactance can be written as 1.05 $X_m$. The value of $X_e$ at the two load points is used to extrapolate the value at no-load to yield $X_m$. The value of $X_e$ at zero-load is the magnetizing reactance $X_m$. In addition, the slip s is used as a measure of the load. Through experimentation using different load points and different motors, it has been found that the following equation yields a very close value for the magnetizing reactance $X_{mt}$ to be used for estimating the stator leakage reactance $X_1$:

$$X_{mi} = X_{e1} + \frac{(X_{e2} - X_{e1})s_1^{\frac{1}{4}}}{(s_1 - s_2)^{\frac{1}{4}}}. \tag{11}$$

In equation (11) above, $s_1$ is the slip at a high load and $s_2$ is the slip at a low load, noting that $s_1$ is greater than $s_2$. The value of $X_{mi}$ may then be used to establish the value of $X_1$, in accordance with equation (1) provided above.

Once the value of $X_1$ is obtained, new values for $R_t$ and $X_e$ may be obtained. These new values of $R_t$ and $X_e$ are based on a fixed known value of the stator reactance $X_1$, and may be determined in accordance with the following equations:

$$\alpha_1 = \frac{1}{R_{t1}} - \frac{1}{R_{t2}}; \text{ and} \tag{12}$$

$$\alpha_2 = \frac{1}{X_{e1}} - \frac{1}{X_{e2}}. \tag{13}$$

There now are four equations and four unknowns. The unknowns are $R_2$, $X_2$, $R_c$, and $X_m$. To eliminate $R_c$, equation (3) is subtracted from equation (2) to yield the following equation:

$$\alpha_1 = \frac{\frac{R_2}{s_1}\left(\frac{R_2^2}{s_2^2} + X_2^2\right) - \frac{R_2}{s_2}\left(\frac{R_2^2}{s_1^2} + X_2^2\right)}{\left(\frac{R_2^2}{s_1^2} + X_2^2\right)\left(\frac{R_2^2}{s_2^2} + X_2^2\right)}. \tag{14}$$

To eliminate $X_m$, equation (5) is subtracted from equation (4) yielding the following equation:

$$\alpha_2 = \frac{X_2\left(\frac{R_2^2}{s_2^2} + X_2^2\right) - X_2\left(\frac{R_2^2}{s_1^2} + X_2^2\right)}{\left(\frac{R_2^2}{s_1^2} + X_2^2\right)\left(\frac{R_2^2}{s_2^2} + X_2^2\right)}. \tag{15}$$

From the equations provided above, equations may now be established for $R_2$, $X_2$, $R_c$, and $X_m$. By dividing equation (14) by equation (15), the following relationship for the $X_2$ and $R_2$ can be established:

$$X_2 = \gamma R_2. \tag{16}$$

where $\gamma$ is given by the following equation:

$$\gamma = \frac{-\alpha_1(s_1 + s_2)}{2\alpha_2 s_1 s_2} + \frac{\sqrt{\left(\frac{\alpha_1}{\alpha_2}\right)^2(s_1 + s_2)^2 + 4s_1 s_2}}{2s_1 s_2}. \tag{17}$$

The rotor resistance $R_2$ may be established by substituting $\gamma R_2$ for $X_2$ in equation (15) and using algebraic manipulation to produce the following equation:

$$R_2 = \frac{\frac{\gamma}{\alpha_2}}{\left(\frac{1}{s_1^2 + \gamma^2}\right)} - \frac{\frac{\gamma}{\alpha_2}}{\left(\frac{1}{s_2^2 + \gamma^2}\right)}. \tag{18}$$

In addition, the core loss resistance $R_c$ may be established in terms of $R_2$ and $X_2$ by manipulating equation (2) to produce the following equation:

$$R_c = \frac{1}{\left(\frac{1}{R_{t1}} - \frac{\frac{R_2}{s_1}}{\left(\frac{R_2^2}{s_1^2} + X_2^2\right)}\right)}. \tag{19}$$

Finally, the magnetizing reactance $X_m$ may be established in terms of $R_2$ and $X_2$ by manipulating equation (4) to produce the following equation:

$$X_m = \frac{1}{\left(\frac{1}{X_{e1}} - \frac{X_2}{\left(\frac{R_2^2}{s_1^2} + X_2^2\right)}\right)}. \tag{20}$$

The data processing module 82 is programmed to use the above-described equations and methodology to establish estimated values of rotor resistance $R_2$, leakage reactance $X_2$, core loss resistance $R_c$, and magnetizing reactance $X_m$. Voltage and current input data are obtained at the two load points and provided to the processor module 84. Input power data also may be obtained at the same two points or calculated from the voltage, current, and/or resistance data. In addition, motor speed data also is provided to the data processing module 82. The motor speed data may be the RPM of the motor or the slip. Ideally, the measurements at the two load points are made simultaneously to avoid potential change due to a change in the operating condition of the motor. In addition, in the illustrated embodiment the line-to-line electrical resistance of the stator is provided to the processor. The phase resistance is established by averaging the line-to-line resistance and dividing by 2. The data processing module 82 is operable to establish the value of the equivalent reactances $X_{e1}$ and $X_{e2}$ using equations (6) through (10) provided above at each load point. The processor also is operable to establish the initial magnetizing reactance $X_{mt}$ using equation (11) provided above. In addition, the processor is operable to establish the value of the phase leakage reactance $X_1$ from the magnetizing reactance $X_{mt}$. Using the value of $X_1$, the processor is operable to find new values for the equivalent resistances $R_{t1}$, $R_{t2}$, $X_{e1}$, and $X_{e2}$, where:

$$R_{t1} = \frac{R_{e1}}{s_1}; \text{ and} \quad (21)$$

$$R_{t2} = \frac{R_{e2}}{s_2}. \quad (22)$$

The system may also be operated to estimate motor operating parameters based on the values of $X_1$, $R_2$, $X_2$, $R_c$, and $X_m$, as represented by block 118. For example, the system may be adapted to establish the values of the rotor torque T, the rotor temperature, and the motor efficiency based on the values of $R_2$, $X_2$, $R_c$, and $X_m$, electrical input data and rotor speed data. The rotor current $I_2$ may be established using the following equation:

$$I_2 = \left(I_1 - \frac{(V_{1R} - I_1 R_1)}{R_c} - \frac{(V_{1i} - I_1 X_1)}{X_m}\right) + \quad (23)$$
$$j\left(\frac{(V_{1R} - I_1 R_1)}{X_m} - \frac{(V_{1i} - I_1 X_1)}{R_c}\right).$$

The shaft torque may be obtained from the rotor resistance $R_2$ and the rotor current $I_2$, as follows:

$$T \text{ (N-m)} = \frac{3 I_{2rms}^2 R_2}{\omega_s s}. \quad (24)$$

In the above equation, $I_{2rms}$ is the rms value of the rotor current $I_2$, and $\omega_s$ is the mechanical synchronous speed in rad/second given by:

$$\omega_s = \frac{4\pi f}{p}. \quad (25)$$

In this equation, f is the alternating current frequency in Hz and p is the number of poles of the motor.

The shaft torque may be converted to foot-pounds by multiplying the torque in Newton-meters by 0.738. In addition, the shaft torque is modified by subtracting the friction and the windage loss $R_{F\&W}$ and the stray load loss using published values and NEMA standards, as shown in the following table:

| Motor Power | SLL % of output power |
|---|---|
| 1–125 HP | 1.8 |
| 126–500 HP | 1.5 |
| 501–2499 HP | 1.2 |

The motor efficiency is established by dividing the estimated output mechanical power by the input electrical power.

$$\eta = \frac{P_{out}}{P_{in}}. \quad (26)$$

The estimated output mechanical power $P_{out}$ may be established from the torque T and the rotor speed data.

The above-described technique was used to estimate the efficiency of a 10 HP motor and a 600 HP motor using data from a motor design program and test data. The following are the results obtained for a 10 HP motor and the discussion of these results.

| Motor Data: | HP: 10 | Elec. Des.: E9893A A |
|---|---|---|
| | RPM: 1175 | Frame: 0256T |
| | Enclosure: TEFC | |
| | Volts: 575 | Design: B |
| | Amp: 10.1 | LR Code: G |
| | Duty: Cont. | Rotor: 418138071HE |
| | INS/AMB/S.F.: F/40/1.15 | Stator: 418126002AJ |
| | TYP/PH/HZ: P/3/60 | FAN: 702675001A |

Using data from the program at full load and at ¼ load, the parameters of the motor were identified using the new method. The following is a summary of the results.

| | Estimated Efficiency | Program Efficiency | % Error |
|---|---|---|---|
| Full Load | 91.315 | 91.097 | 0.239% |
| ¾ Load | 92.154 | 91.850 | 0.330% |
| ½ Load | 92.101 | 91.661 | 0.479% |
| ¼ Load | 89.005 | 88.186 | 0.928% |

From the above results it can be seen that the error in the estimated efficiency is less than 1% of the efficiency obtained from the program results. It can also be observed that the error increases as the load decreases. By examining the calculated losses it was noticed that the calculated core loss is less than the program value by 19 watts. This fixed error becomes a larger percentage of the total loss at low loads and as a result the percentage error in efficiency increases as the load decreases.

The estimated efficiency was also compared to laboratory test data. The following is a summary of the results for the 10 HP motor.

| | Estimated Efficiency | Actual Efficiency | % Error |
|---|---|---|---|
| Full Load | 89.98 | 90.310 | −0.36% |
| ¼ Load | 86.18 | 86.530 | −0.41% |

The estimated core loss in this case was more than the measured value leading to a lower estimated efficiency than the measured efficiency.

The procedure was repeated for a 600 HP motor. The following are the results obtained for a 600 HP motor and the discussion of these results.

| Motor Data: | HP: 600 | Elec. Des.: |
|---|---|---|
| | RPM: 1195 | Frame: 35C5012Z |
| | Enclosure: TEFC | |
| | Volts: 575 | Design: 139481 |
| | Amp: 532 | LR Code: |
| | Duty: Cont. | Rotor: 710623-2-S |
| | INS/AMB/S.F.: F/ /1.15 | Stator: 710622-2-T |

Comparing the design program data to the estimated values from the above-described process, the following results were obtained:

| | Estimated Efficiency | Program Efficiency | % Error |
|---|---|---|---|
| Full Load | 95.794 | 95.791 | 0.003% |
| ¾ Load | 95.843 | 95.855 | −0.013% |

-continued

|  | Estimated Efficiency | Program Efficiency | % Error |
|---|---|---|---|
| ½ Load | 95.318 | 95.352 | −0.035% |
| ¼ Load | 92.655 | 92.710 | −0.059% |

The difference between the design program data and estimated value data is less 0.04%. Initially, the resolution selected for use with the design program data for the speed of the motor was one decimal point. The results obtained using one decimal point resolution on speed lead to higher error in estimation. The results provided above were obtained using a higher resolution on speed. In addition, this particular motor has a very low slip. The slip in RPM at full load is less than 5 RPM so that any error in the speed measurement will lead to a large error in estimation. The following are the results obtained using four decimal points resolution, three decimal points resolution, two decimal points and one decimal point resolution to illustrate the effect of resolution on the efficiency estimation.

|  | Estimated Efficiency | Program Efficiency | % Error |
|---|---|---|---|
| Four Decimal Points Resolution: | | | |
| Full Load | 95.795 | 95.791 | 0.0036% |
| ¾ Load | 95.844 | 95.855 | −0.0122% |
| ½ Load | 95.320 | 95.352 | −0.0338% |
| ¼ Load | 92.658 | 92.710 | −0.0550% |
| Three Decimal Points Resolution: | | | |
| Full Load | 95.797 | 95.791 | 0.0065% |
| ¾ Load | 95.848 | 95.855 | −0.008% |
| ½ Load | 95.325 | 95.352 | −0.028% |
| ¼ Load | 92.669 | 92.710 | −0.044% |
| Two Decimal Points Resolution: | | | |
| Full Load | 95.887 | 95.791 | −0.0143% |
| ¾ Load | 95.969 | 95.855 | −0.0364% |
| ½ Load | 95.509 | 95.352 | −.0705% |
| ¼ Load | 93.031 | 92.710 | −0.1297% |
| One Decimal Point Resolution: | | | |
| Full Load | 95.008 | 95.791 | −0.817% |
| ¾ Load | 94.776 | 95.855 | −0.840% |
| ½ Load | 93.708 | 95.352 | −1.200% |
| ¼ Load | 89.494 | 92.710 | −3.486% |

From the above results it can be concluded that to provide a good estimation of efficiency for low slip motors using this method it is preferable to have a resolution on speed to at least two decimal points. The reason for this is that if the resolution is less than two decimal points the error in slip causes an error in the estimation of the core loss, yielding a higher overall error.

The system was then operated using lab test data for the 600 HP motor. The resolution of the speed that was used was 1 RPM. This resolution is less than the minimum recommended for obtaining good results. The results using this coarse resolution are shown below.

|  | Estimated Efficiency | Program Efficiency | % Error |
|---|---|---|---|
| Full Load | 96.59 | 96.65 | −0.052% |
| ¾ Load | 95.87 | 96.68 | −0.840% |
| ½ Load | 95.02 | 96.17 | −1.20% |
| ¼ Load | 95.95 | 93.62 | 2.480% |

From these results, it can be concluded that the method yields excellent results for regular slip motors. However, for low slip motors the resolution on the RPM of the motor is preferably at least two decimal points so as to get a good estimate of the motor efficiency in the field. One way of obtaining excellent resolution of the motor speed is by using accelerometers to measure the motor vibration and find its spectrum.

A comparison between the losses seen in the design program and the estimated losses using the above-described method is provided below.

|  | Design Program | New Method |
|---|---|---|
| Rotor Loss: | | |
| Full Load | 1.79 KW | 1.785 KW |
| ¾ Load | .980 KW | .979 KW |
| ½ Load | .430 KW | .429 KW |
| ¼ Load | .107 KW | .107 KW |
| Core Loss: | | |
| Full Load | 5.77 KW | 5.756 KW |
| ¾ Load | 5.81 KW | 5.852 KW |
| ½ Load | 5.85 KW | 5.924 KW |
| ¼ Load | 5.9 KW | 5.975 KW |

The results illustrate general agreement between the design program results and the new method of estimating motor parameters describe above.

Figure 6:
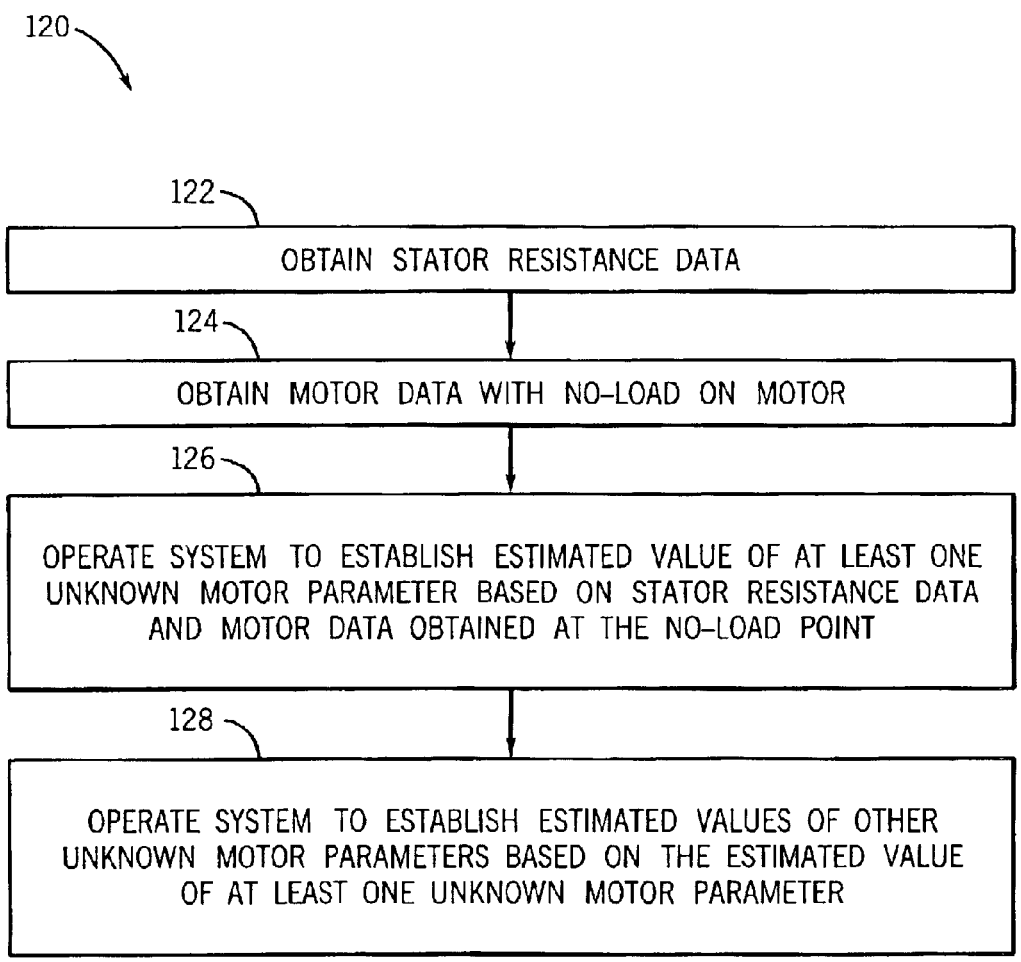
FIG. 6 is an alternative process for providing estimated values of various motor operating parameters based on data obtained with no-load on the motor, according to an exemplary embodiment of the present invention.

Referring generally to FIG. 6, an alternative process for establishing estimated values of various motor electrical parameters using data obtained at a single operating point with no load on the motor is shown and designated generally by reference numeral 120. In addition, the estimated values of the motor electrical parameters may be used to establish estimated values of various motor operating parameters. The process comprises obtaining stator resistance $R_1$ data, as represented by block 122. The line-to-line input resistance may be measured, averaged, and divided by 2 to determine the phase resistance $R_1$. The process also comprises obtaining electrical input data with no load on the motor and providing the data to the processor module 84, as represented by block 124. To achieve the no-load condition, the motor is disconnected from its load. The electrical input data obtained at the first load points comprises: input voltage data, input current data. Some data may be provided to the system 80 using the control module 90 or may be provided from a remote station 98 via the network 96. The current with no-load $I_{nl}$ may be measured for each phase and averaged. The three line voltages may be measured, averaged, and divide by $\sqrt{3}$ to determine the phase voltage $V_1$.

The data processing module 82 may then be operated to establish estimated values of various motor parameters, as represented by block 126. The programming instructions are provided to the data processing module 82 are adapted to utilize a novel technique for establishing the values of the various motor parameters using data obtained with no-load on the motor. With no load on the motor, the rotor portion of the circuit will effectively be an open circuit and is assumed to be an open circuit for these purposes. The current $I_2$ will be sufficiently small to handle the windage and friction load of the rotor. With no load on the motor, the stator current $I_1$ will be the no-load current $I_{nl}$. The stator leakage inductance $L_1$, the magnetizing inductance $L_m$ and the core loss resistance $R_c$ may be established using the following equations. First, the total resistance $R_t$ may be obtained by the following equation:

$$R_t = \frac{P}{I_{nl}^2}. \tag{27}$$

The total impedance Z may be found by dividing the input voltage $V_1$ by the no-load current $I_{nl}$, as follows:

$$Z = \frac{V_1}{I_{nl}}. \tag{28}$$

The total reactance $X_1+X_m$ may be found from the total impedance Z and the total resistance $R_t$, as follows:

$$X_1+X_m=\sqrt{Z^2-R_t^2}. \tag{29}$$

The individual values for the stator reactance $X_1$ and the magnetizing reactance $X_m$ may be found from the assumed relationship of $X_1=0.05\ X_m$, as follows:

$$X_1+X_m=1.05X_m. \tag{30}$$

Next, the motor friction and windage power $P_{F\&W}$ may be estimated based on the motor size and construction, if known. If not, the motor friction and windage power $P_{F\&W}$ is combined with the core loss. The equivalent resistance $R_{W\&F}$ due to motor friction and windage power $P_{F\&W}$ may be estimated as follows:

$$R_{W\&F} = \frac{P_{W\&F}}{I_{nl}^2}. \tag{31}$$

The series core loss resistance $R_m$, may be established as follows:

$$R_m=R_t-R_1-R_{W\&F}. \tag{32}$$

The parallel magnetizing inductance $L_m$, may be established as follows:

$$L_m = \frac{X_m^2 + R_m^2}{X_m \omega}. \tag{33}$$

The parallel core resistance $R_c$, may be established as follows:

$$R_c = \frac{X_m^2 + R_m^2}{R_m}. \tag{34}$$

The stator leakage inductance $L_1$, may be established as follows:

$$L_1 = \frac{X_1}{\omega}. \tag{35}$$

As with the previous two load point method, the data processing module 82 may be used to estimate other motor parameters based on the estimated motor electrical parameter data obtained above, as represented by block 128. An expression of the rotor current $I_2$ may be obtained from the voltage across the rotor and the rotor impedance. Designating the voltage across the rotor as $V_a$ and the rotor current as $I_2$, the following equation can be written:

$$I_2 = \frac{V_a}{\frac{R_2}{S} + j\omega L_2}. \tag{36}$$

The rotor current can also be expressed using the input current $I_1$, the current through the magnetizing inductance $I_m$, and the current through the core resistance $I_c$, as follows:

$$I_2 = I_1 - I_c - I_m. \tag{37}$$

The above currents can be expressed in terms of the voltage and the value of the motor parameters as follows:

$$V_a = V_1 - I_1(R_1 + j\omega L_1); \tag{38}$$

$$I_c = \frac{V_a}{R_c}; \text{ and} \tag{39}$$

$$I_m = \frac{V_a}{j\omega L_m}. \tag{40}$$

The following expression for $I_2$ may be obtained by manipulating the equations above and substituting the expressions for $I_1$, $I_c$, and $I_m$ from equations (38)–(40) into equation (37):

$$I_2 = I_1 - \frac{(V_1 - I_1(R_1 + j\omega L_1))}{R_c} - \frac{(V_1 - I_1(R_1 + j\omega L_1))}{j\omega L_m}. \tag{41}$$

Equations (36) and (41) can now be equated to obtain an equation relating the input current, the input voltage, and the motor parameters. Because the resulting equation has a real part and imaginary part, this will yield two equations. The input current can be written as a complex quantity:

$$I_1 = I_{1R} - jI_{1i} \tag{42}$$

Two equations, one representing the real part and one representing the imaginary part, may be obtained using equations (34), (39) and (40). The real part is as follows:

$$\left(I_{1R} - \frac{V_1}{R_c} + \frac{I_{1R}R_1}{R_c} + \frac{I_{1i}\omega L_1}{R_c} + \frac{I_{1R}L_1}{L_m} - \frac{R_1 I_{1i}}{\omega L_m}\right)\left(\frac{R_2^2}{s^2} + \omega^2 L_2^2\right) = \tag{43}$$

$$\frac{R_2}{S}(V_1 - I_{1R}R_1 - I_{1i}\omega L_1) - \omega L_2(\omega L_1 I_{1R} - R_1 I_{1i}).$$

The imaginary part will be given by:

$$\left(-I_{1i} + \frac{\omega L_1 I_{1R}}{R_c} - \frac{R_1 I_{1i}}{R_c} + \frac{V_1}{\omega L_m} - \frac{I_{1R}R_1}{\omega L_m} - \frac{I_{1i}L_1}{L_m}\right)\cdot\left(\frac{R_2^2}{s^2} + \omega^2 L_2^2\right) = \tag{44}$$

$$-\frac{R_2}{s}(\omega L_1 I_{1R} - R_1 I_{1i}) - \omega L_2(V_1 - I_{1R}R_1 - I_{1i}\omega L_1).$$

Equations 43 and 44 can be written as:

$$\alpha_1\left(\frac{R_2^2}{S^2} + \omega^2 L_2^2\right) = \alpha_2 R_2 + \alpha_3 L_2; \text{ and} \tag{45}$$

$$\beta_1\left(\frac{R_2^2}{S^2} + \omega^2 L_2^2\right) = \beta_2 R_2 + \beta_3 L_2; \tag{46}$$

where the different variables are given by:

$$\alpha_1 = I_{1R} - \frac{V_1}{R_c} + \frac{I_{1R}R_1}{R_c} + \frac{I_{1i}\omega L_1}{R_c} + \frac{L_1 I_{1R}}{L_m} - \frac{R_1 I_{1i}}{\omega L_m}; \qquad (47)$$

$$\alpha_2 = \frac{V_1 - I_{1R}R_1 - I_{1i}\omega L_1}{s}; \qquad (48)$$

$$\alpha_3 = -\omega(\omega L_1 I_{1R} - R_1 I_{1i}); \qquad (49)$$

$$\beta_1 = -I_{1i} + \frac{\omega L_1 I_{1R}}{R_c} - \frac{R_1 I_{1i}}{R_c} + \frac{V_1}{\omega L_m} - \frac{I_{1R}R_1}{\omega L_m} - \frac{I_{1i}L_1}{L_m}; \qquad (50)$$

$$\beta_2 = \frac{\alpha_3 S}{\omega}; \text{ and} \qquad (51)$$

$$\beta_3 = -\alpha_2 \omega S. \qquad (52)$$

Dividing equations (43) and (44) and solving for the rotor inductance in terms of the rotor resistance one gets:

$$L_2 = \gamma R_2; \qquad (53)$$

where:

$$\gamma = \frac{\alpha_1 \beta_2 - \alpha_2 \beta_1}{\alpha_3 \beta_1 - \alpha_1 \beta_3}. \qquad (54)$$

Solving for the rotor resistance, the following relationship results:

$$R_2 = \frac{\frac{\alpha_2}{\alpha_1} + \frac{\alpha_3 \gamma}{\alpha_1}}{\omega^2 \gamma^2 + 1/s^2}. \qquad (55)$$

The following process may be used for calculating motor torque and motor efficiency. First, estimate the slip s from the shaft speed N and the synchronous speed $N_s$, as follows:

$$s = \frac{N_s - N}{N_s}. \qquad (56)$$

The synchronous speed Ns may be obtained from the input frequency and the number of poles of the motor. The power factor may then be computed using the input current, input voltage, and input power.

Next, the real and imaginary components of the current $I_{1R}$ & $I_{1i}$ are established using equations (47–54). The rotor resistance may then be established using the following equation:

$$R_2 = \frac{\left(\frac{\alpha_2}{\alpha_1} + \frac{\alpha_3}{\alpha_1}\gamma\right)}{\left(\omega^2 \gamma^2 + \frac{1}{s^2}\right)}. \qquad (57)$$

The rotor current and torque can be calculated using the following equations:

$$I_2 = \sqrt{\alpha_1^2 + \beta_1^2}. \qquad (58)$$

The torque T may be estimated by:

$$T \text{ (in Newton-meters)} = \frac{3 * I_{2rms}^2 * R_2}{\omega_s * S}; \qquad (59)$$

where $$\omega_s = \frac{4\pi f}{p}$$

is the synchronous speed and p is the number of poles. To convert the torque to ft-lbs multiply the T in Newton-meters by 0.738.

For the purpose of calculating motor efficiency the output power needs to be calculated. This can be obtained using the following equation:

$$\text{Output Power } P_{out} = \frac{TN}{5252} - P_{F\&W} - SLL; \qquad (60)$$

where, T is shaft torque in ft-lb and SLL is the stray load power loss, which is typically a known percentage motor power depending on motor size and varies with the square of the torque. The Nema standard specifies certain percentage of output power as SLL. This percentage changes as the motor power changes. For example, for 1 to 125 HP motors, the SLL is equal to 1.8% of maximum power. For 126 to 500 HP motors, the SLL is equal to 1.5% of maximum power. Finally, for 501 to 2499 HP motors, the SLL is equal to 1.2% of maximum power.

As mentioned above, if the friction and windage loss is not known, its value can be lumped with the core loss. The effect of lumping the friction and windage loss with core loss is to cause the rotor loss to be lower than the actual loss, thus raising the estimated efficiency, since the effect of lumping the friction and windage loss with the core loss is to reduce the power across the air gap by the friction and windage loss. In this circumstance, the rotor loss is the motor slip times the friction and windage loss. To obtain an estimate of the maximum error using this approximation, a value of slip equal to 0.025 and a maximum percentage of friction and windage loss of motor power equal to 3% may be used. This yields a maximum error in estimating the efficiency equal to 0.075%, which is within the measurement error. Tests conducted on different motors indicate the validity of the assumption. If the value of the friction and windage loss is known, then that value may be used. The motor efficiency may then be estimated using the ratio of the estimated output power to the input power. The above-described method was applied to experimental data and the results indicate an accuracy of over 99%.

It is important to note that the core loss is obtained at a constant frequency. If the motor used at a different frequency, then the core loss needs to be estimated at the new frequency. In general the core loss is proportional to the square of frequency and to the magnitude of the flux density. If the flux density is constant then a simple equation can be used to estimate the core loss at a different operating frequency.

Test Results:

The no-load data from three motors were used to test the accuracy of the above method. The following is a summary of the data obtained.

| 10 HP Motor: | | |
|---|---|---|
| Motor Data: | HP: 10 | Elec. Des.: E9893A A |
| | RPM: 1175 | Frame: 0256T |
| | Enclosure: TEFC | |
| | Volts: 575 | Design: B |
| | Amp: 10.1 | LR Code: G |
| | Duty: Cont. | Rotor: 418138071HE |
| | INS/AMB/S.F.: F/40/1.15 | Stator: 418126002AJ |
| | TYP/PH/HZ: P/3/60 | FAN: 702675001A |
| | No load Current: | 4.41 ampere |
| | No Load Voltage: | 574.9 volts |
| | No Load Power: | 261.73 watts |
| | Stator Resistance: | 0.8765 ohm |
| | F&W power: | 57 watts |
| | Stray Load Loss: | 1.13% obtained from experimental data |

The results obtained are as follows:

| Actual Motor Efficiency at full load = | 90.2434% |
|---|---|
| Estimated Motor Efficiency = | 90.8452% |
| Estimation Error = | 0.6357% |

| 150 HP Motor: | | |
|---|---|---|
| Motor Data: | HP: 150 | Elec. Des.: W00868-A-A001 |
| | RPM: 1180 | Frame: EC360 |
| | Enclosure: TENV | |
| | Volts: 460 | |
| | Amp: 10.1 | |
| | Duty: 15 Min | |
| | INS/AMB/S.F.: F/ /1.15 | |
| | No Load Current: | 66.09 ampere |
| | No Load Voltage: | 460 volts |
| | No Load Power: | 2261 watts |
| | Stator resistance: | 0.03509 ohm |
| | F & W power: | 896 watts |
| | Stray Load Loss: | 0.85% from test data |

The results obtained are as follows:

| Actual Motor Efficiency at full load = | 93.106% |
|---|---|
| Estimated Motor Efficiency = | 93.413% |
| Estimation Error = | 0.3303% |

| 600 HP Motor: | | |
|---|---|---|
| Motor Data: | HP: 600 | Elec. Des.: |
| | RPM: 1195 | Frame: 35C5012Z |
| | Enclosure: TEFC | |
| | Volts: 575 | Design: 139481 |
| | Amp: 532 | LR Code: |
| | Duty: Cont. | Rotor: 710623-2-S |
| | INS/AMB/S.F.: F/ /1.15 | Stator: 710622-2-T |
| | No Load Current = | 148.45 ampere |
| | No Load Voltage = | 575 volts |
| | No Load Power = | 6860 watts |
| | Stator resistance = | .0091 ohm |
| | F & W power = | 1725 watts |
| | Stray Load Loss = | 1.3% from Test data |

The results obtained are as follows:

| Actual Motor Efficiency at full load = | 96.025% |
|---|---|
| Estimated Motor Efficiency = | 95.976% |
| Estimation Error = | −0.0500% |

To make the estimation of the motor efficiency less sensitive to slight errors in measured frequency, the following process may be performed. First, the stator loss is calculated using the input current and the estimated stator resistance $R_1$. The friction and windage loss is estimated based on the motor size, type, and speed. The rotor loss may be estimated by subtracting the stator loss from the Input power P and multiplying the remainder by the slip. The stray load loss SLL is estimated based on the IEEE standard, as described above, with the exception that the core loss is neglected. The modified input power is then calculated at the two measurement points by subtracting the above losses from the input power P.

A plot of the modified input power versus measured speed may then be performed to determine the core loss. The core loss is the modified input power at the synchronous speed $n_s$. This can be determined mathematically using the following equation:

$$CoreLoss = \left(P_1 - n_1\left(\frac{P_2 - P_1}{n_2 - n_1}\right)\right) + \left(\frac{P_2 - P_1}{n_2 - n_1}\right)n_s; \quad (61)$$

where:
$P_1$ Modified Input power at point 1 "low load"
$P_2$ Modified Input power at point 2 "high load"
$n_1$ Motor speed at point 1
$n_2$ Motor speed at point 2
$n_S$ Synchronous speed using the measured frequency at low load.

The rotor loss and the stray load loss SLL may then be recalculated using the new core loss value. The magnetizing inductance $L_m$, rotor resistance $R_2$, and rotor leakage inductance $L_2$ are calculated as provided previously. This method was found to be less sensitive to error in frequency measurements.

The temperature of the rotor during motor operation may be estimated using the estimated value of the rotor resistance $R_2$ and the following equation relating changes in electrical resistance of the rotor to changes in temperature:

$$R_{2hot} = R_{2cold}(1+\alpha(T_{hot}-T_{cold})); \quad (62)$$

where: $R_{2cold}$ is the rotor resistance at a first temperature; $R_{2hot}$ is the rotor resistance at a second temperature; $T_{cold}$ is the rotor temperature at a first temperature; $T_{hot}$ is the rotor temperature at a second temperature; and $\alpha$ is the temperature coefficient of electrical resistance of the rotor in $\Omega$/unit of temperature.

As an example, the above equation may be manipulated algebraically to obtain the following equation for an aluminum rotor:

$$T_{hot} = \frac{R_{2hot}}{R_{2cold}} * (225 + T_{cold}) - 225. \quad (63)$$

The value used for $R_{2hot}$ is the estimated value for the rotor resistance $R_2$ at the second temperature $T_{hot}$. The control module 90 may be used to input the rotor temperature at the first temperature $T_{cold}$ and the rotor resistance at the first temperature $R_{2cold}$. In addition, the data may be provided by the remote stations 98 via the network 96.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An electric motor system, comprising:
   an electronic device that is operable to establish estimated values of a plurality of electrical parameters of a motor based on electrical input data and stator resistance data.

2. The electric motor system as recited in claim 1, wherein the electronic device is operable to establish an estimated value of an operating parameter of the motor based on the estimated values of electrical parameters of the motor.

3. The system as recited in claim 2, wherein the operating parameter is motor torque.

4. The system as recited in claim 2, wherein the operating parameter is motor efficiency.

5. The system as recited in claim 1, wherein the operating parameter is rotor temperature.

6. The system as recited in claim 1, wherein the operating parameter is electrical current induced in the rotor.

7. The system as recited in claim 1, wherein the plurality of electrical parameters of the motor comprises electrical resistance of the rotor during operation of the motor.

8. The system as recited in claim 1, wherein the plurality of electrical parameters of the motor comprises stator inductance.

9. The system as recited in claim 1, wherein the electrical input data comprises input voltage, input current, and input frequency.

10. The system as recited in claim 1, wherein the electronic device establishes the estimated values of a plurality of electrical parameters of a motor based on electrical input data and motor speed data obtained at at least two different load conditions of the motor.

11. The system as recited in claim 1, wherein the electronic device establishes the estimated values of a plurality of electrical parameters of a motor based on electrical input data obtained with no load on the motor.

12. The system as recited in claim 2, comprising a visual display operable to provide a visual indication of at least one of the estimated values of a plurality of electrical parameters and the estimated valve of an operating parameter.

13. The system as recited in claim 1, comprising: a communication module operable to enable data to be manually provided to the system.

14. The system as recited in claim 1, wherein the electronic device is coupleable to an external communications network.

15. An instrumentation device, comprising:
   a processing system that is operable to establish estimated values of a plurality of electrical characteristics of a motor based on non-electrical characteristic data of the motor provided to the processing system, wherein the processing system also is operable to establish at least one operating parameter of the motor based on the estimated values of a plurality of electrical characteristics of the motor.

16. The device as recited in claim 15, wherein the processing system is operable to establish the estimated values of a plurality of electrical characteristics of a motor based on stator resistance data and electrical input data obtained with no load on the motor.

17. The device as recited in claim 15, wherein the processing system is operable to establish the estimated values of a plurality of electrical characteristics of a motor based on stator resistance data, and electrical input data and rotor speed data obtained at a plurality of load conditions of the motor.

18. The device as recited in claim 15, comprising an input module to enable data to be provided to the system.

19. The device as recited in claim 15, wherein the plurality of motor electrical characteristics comprises rotor reactance.

20. The device as recited in claim 15, wherein the plurality of motor electrical characteristics comprises core loss resistance.

21. The device as recited in claim 15, wherein the plurality of motor electrical characteristics comprises rotor resistance.

22. The device as recited in claim 15, wherein the plurality of motor electrical characteristics comprises is magnetizing reactance.

23. The device as recited in claim 15, wherein the at least one operating parameter comprises rotor torque.

24. The device as recited in claim 15, wherein the at least one operating parameter comprises motor efficiency.

25. The device as recited in claim 15, wherein the at least one operating parameter comprises rotor temperature.

26. A method of operating a motor having a rotor and a stator, comprising:
   providing an instrumentation system with stator resistance data for the motor;
   providing the instrumentation system with electrical input data obtained during operation of the motor with no load on the motor; and
   operating the instrumentation system to establish estimated values of a plurality of electrical parameters of the motor based on the stator resistance data and the electrical input data.

27. The method as recited in claim 26, further comprising:
   providing the instrumentation system with electrical input data obtained during operation of the motor with a load on the motor;
   providing the instrumentation system with shall speed data obtained during operation of the motor with the load on the motor; and
   operating the instrumentation system to establish an estimated value of at least one motor operating parameter based on the estimated values of a plurality of electrical parameters, the shaft speed data, and the electrical input data obtained during operation of the motor with the load on the motor.

28. The method as recited in claim 26, wherein providing the instrumentation system with electrical input data comprises obtaining the data at a location electrically coupled to the motor and compensating for the resistance of wiring between the location and the motor.

29. A method of operating a motor having a rotor and a stator, comprising:
   providing an instrumentation system with stator resistance data for the motor;
   providing the instrumentation system with rotor speed data and electrical input data obtained during operation of the motor with a first load on the motor;
   providing the instrumentation system with rotor speed data and electrical input data obtained during operation of the motor with a second load on the motor; and
   operating the instrumentation system to establish estimated values of a plurality of electrical parameters of the motor based on the stator resistance data and the rotor speed data and electrical input data obtained during operation of the motor with the first and second loads on the motor.

30. The method as recited in claim 29, further comprising:

operating the motor at a given load on the motor;

providing the instrumentation system with electrical input data obtained during operation of the motor with given load on the motor;

providing to the instrumentation system with shaft speed data obtained during operation of the motor with the given load on the motor; and operating the instrumentation system to establish an estimated value of at least one motor operating parameter based on the estimated values of a plurality of electrical parameters, the shaft speed data, and the electrical input data obtained during operation of the motor with the given load on the motor.

31. The method as recited in claim 29, wherein providing the instrumentation system with electrical input data comprises obtaining the data at a location electrically coupled to the motor and compensating for the resistance of wiring between the location and the motor.

32. A system for estimating an operating parameter of an electric motor, comprising:

means for providing rotor speed data to an electronic system;

means for providing electrical input data to the electronic system;

means for establishing an estimated value of at least one electrical parameter of the motor based on rotor speed data and electrical input data; and means for establishing an estimated value of at least one motor operating parameter based on rotor speed data, electrical input data, and the estimated value of at least one electrical parameter of the motor.

33. A program stored in a tangible medium, wherein the program is operable to enable a processing system to establish an estimated value of at least one electrical parameter of a motor based on stator resistance data and electrical input data.

34. The program as recited in claim 33, wherein the program is operable to establish the estimated value of at least one electrical parameter of a motor based on electrical input data obtained with no load on the motor.

35. The program as recited in claim 33, wherein the program is operable to establish the estimated value of at least one electrical parameter of a motor based on electrical input data and rotor speed data obtained at at least two load conditions of the motor.

* * * * *